United States Patent
Hsieh

(12)
(10) Patent No.: US 6,649,472 B1
(45) Date of Patent: Nov. 18, 2003

(54) METHOD OF MANUFACTURING A FLASH MEMORY CELL WITH HIGH PROGRAMMING EFFICIENCY BY COUPLING FROM FLOATING GATE TO SIDEWALL

(75) Inventor: Chia-Ta Hsieh, Tainan (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 10/210,954

(22) Filed: Aug. 2, 2002

(51) Int. Cl.7 ............................................. H01L 21/336
(52) U.S. Cl. ...................... 438/257; 438/258; 438/264; 438/266; 438/315
(58) Field of Search ................................ 438/257–258, 438/264–266, 315

(56) References Cited

U.S. PATENT DOCUMENTS

| | | | |
|---|---|---|---|
| 5,717,635 A | * 2/1998 | Akatsu | 365/185.05 |
| 5,814,862 A | * 9/1998 | Sung et al. | 257/344 |
| 5,998,263 A | 12/1999 | Sekariapuram et al. | 438/259 |
| 6,153,494 A | 11/2000 | Hsieh et al. | 438/424 |
| 6,159,801 A | 12/2000 | Hsieh et al. | 438/259 |
| 6,200,856 B1 | 3/2001 | Chen | 438/257 |
| 6,433,384 B1 | * 8/2002 | Hashimoto | 257/316 |

* cited by examiner

*Primary Examiner*—D Le
(74) *Attorney, Agent, or Firm*—George O. Saile; Stephen B. Ackerman; Douglas R. Schnabel

(57) ABSTRACT

A new method to form flash memory devices in the manufacture of an integrated circuit device is achieved. The method comprises providing a substrate. A first film is formed comprising a first oxide layer overlying the substrate and a floating gate layer overlying the first oxide layer. A second film is formed comprising a second oxide layer overlying the first film, a control gate layer overlying the second oxide layer, and an insulating layer overlying the control gate layer. The first and second films are patterned to form stacked gates comprising floating gates and control gates. Ions are implanted into the substrate between the stacked gates to form source and drain regions. A third oxide layer is then formed on the sidewalls of the stacked gates. A plug layer is then deposited overlying the substrate and the stacked gates and filling spaces between the stacked gates. The plug layer is etched down to below the top surface of the stacked gates to form conductive plugs contacting the source and drain regions and to complete the flash memory devices.

13 Claims, 12 Drawing Sheets

METHOD OF MANUFACTURING A FLASH MEMORY CELL WITH HIGH PROGRAMMING EFFICIENCY BY COUPLING FROM FLOATING GATE TO SIDEWALL

BACKGROUND OF THE INVENTION (1) Field of the Invention

The invention relates to a flash memory device and, more particularly, to a method to form a flash memory device having sidewall coupling between the floating gate and source/drain plugs to improve programming efficiency.

(2) Description of the Prior Art

Flash memories are used in a large number of electronic applications. Flash memories can provide random access to stored data such as application programs. Flash memory cells can be written to and read from many times. In this way, flash memory is similar to static or dynamic RAM. However, as an additional advantage, flash memories can retain data during a loss of power supply. By comparison, RAM devices lose memory states if the power supply is removed.

A typical flash memory cell is a modified MOS transistor with a stacked gate. The stacked gate comprises a control gate and a floating gate. The control gate is used to turn the transistor OFF and ON and to thereby control current flow from the drain to the source. The floating gate is placed between the control gate and the device channel. Charge can be injected into or out of the floating gate where it becomes trapped due to the isolation material that surrounds the floating gate. The threshold voltage of the flash transistor cell varies with the charge-state of the floating gate. Binary data values are stored in each flash cell based on the floating gate charge-state.

The process of charging or discharging the floating gate is called erasing or programming. Erasing or programming the flash cell requires that electrons overcome an energy barrier, such as caused by an oxide layer, between the floating gate electrode and the charge source. The energy level of the electrons is raised above this energy barrier value by forcing a relatively large voltage across the barrier. For example, the flash cell may be erased by injecting electrons from the floating gate into the control gate. The control gate is forced to a large positive voltage while the floating gate is capacitively coupled to a low voltage or to a negative voltage. Similarly, the drain, the source, or the channel region of the device may be used to source or to sink electrons during programming and erasing.

Applications of flash memory require that stored data be retained in the memory cells for extended periods. Therefore, the floating gate barrier energy must be large compared to the energy used to read the cell. However, creating a high, energy barrier further requires large programming and erasing voltages. It is also found in the prior art that the program and erase voltage is increased by inadequate capacitive coupling between the floating gate and the source or sink nodes, such as source, drain, or channel regions. That is, much of the voltage for programming or erasing is lost due to poor coupling to the floating gate. Therefore, larger voltage signals must used. These large voltages are generated using charge pump circuits or external supplies. Carefully designed devices or special processing must be used to handle these voltages on-chip. It is therefore a central object of the present invention to reduce the programming and erasing voltages for a flash device by improving the floating gate coupling coefficient.

Several prior art inventions relate to methods to form flash memory devices. U.S. Pat. No. 6,159,801 to Hsieh et al teaches a method to form a split-gate, flash transistor having improved coupling between source and floating gate. In one embodiment, the floating gate has a three-dimensional coupling to the source. The STI oxide bounding the source active area is recessed below the substrate surface such that the floating gate can overlap the source sidewalls. U.S. Pat. No. 6,153,494 to Hsieh et al discloses a method to form a stacked gate, flash cell having improved word line and floating gate coupling. The STI oxide is formed protruding above the surface of the substrate. The floating gates formed between the STI regions have a three-dimensional topology such that the coupling area between the floating gates and the word lines is increased. U.S. Pat. No. 5,998,263 to Sekariapuram et al describes an EEPROM cell having a vertical channel. U.S. Pat. No. 6,200,856 to Chen teaches a flash cell having a self-aligned, stacked gate.

SUMMARY OF THE INVENTION

A principal object of the present invention is to provide an effective and very manufacturable method of forming a flash memory device.

A further object of the present invention to form a flash memory device with improved programming efficiency.

Another further object of the present invention to improve flash programming efficiency by coupling the drain and source voltage to the floating gate using a thin oxide layer between the drain and source plugs and the floating gate.

Another further object of the present invention is to improve programming efficiency by forming an angled profile in the floating gate to enhance the control gate to floating gate electric field.

Another object of the present invention is to provide a flash memory cell with improved programming efficiency.

In accordance with the objects of this invention, a method to form flash memory devices in the manufacture of an integrated circuit device is achieved. The method comprises providing a substrate. A first film is formed comprising a first oxide layer overlying the substrate and a floating gate layer overlying the first oxide layer. A second film is formed comprising a second oxide layer overlying the first film, a control gate layer overlying the second oxide layer, and an insulating layer overlying the control gate layer. The first and second films are patterned to form stacked gates comprising floating gates and control gates. Ions are implanted into the substrate between the stacked gates to form source and drain regions. A third oxide layer is then formed on the sidewalls of the stacked gates. A plug layer is then deposited overlying the substrate and the stacked gates and filling spaces between the stacked gates. The plug layer is etched down to below the top surface of the stacked gates to form conductive plugs contacting the source and drain regions and to complete the flash memory devices.

Also in accordance with the objects of this invention, a flash memory device is achieved. The device comprises a substrate. A stacked gate comprises a floating gate and a control gate. The floating gate comprises a first oxide layer overlying the substrate and a floating gate layer overlying the first oxide layer. The control gate comprises a second oxide layer overlying the floating gate layer and a control gate layer overlying the second oxide layer. Source and drain regions are in the substrate adjacent to the stacked gate. A third oxide layer covers the sidewalls of the stacked gate. Conductive plugs contact the source and drain regions and extend parallel to the stacked gate. The conductive plug layer provides coupling between the drain and source and the floating gate.

BRIEF DESCRIPTION OF THE DRAWINGS

In the accompanying drawings forming a material part of this description, there is shown:

FIGS. 1A and 3A through 12A illustrate first cross-section views of various steps in the preferred embodiment method of the present invention.

FIGS. 1B through 7B and 12B illustrate second cross-section views of various steps in the preferred embodiment method of the present invention.

DESCRIPTION OF THE PREFERRED EMBODIMENTS

The preferred embodiments of the present invention disclose a method to form a flash memory device with improved programming efficiency. The programming efficiency is improved by sidewall coupling between source and drain plugs and the floating gate. Further, a novel floating gate profile is used to maximize the electric field. It should be clear to those experienced in the art that the present invention can be applied and extended without deviating from the scope of the present invention.

Figure 1:
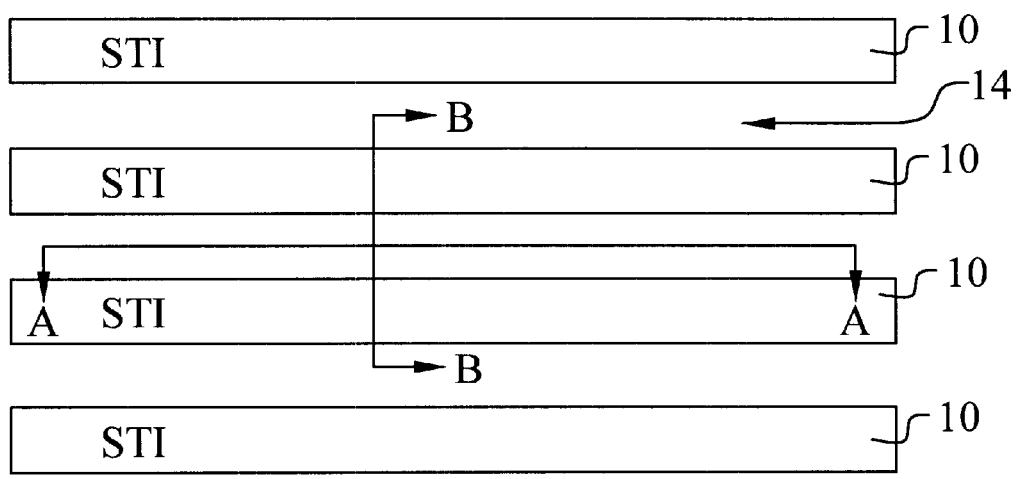
FIGS. 1, 6, 7, and 12 illustrate top layout views of various steps in the preferred embodiment method of the present invention.

Referring now to FIG. 1, a top layout view showing the preferred method of the present invention is illustrated. The preferred embodiment flash memory device is formed on a substrate or wafer. More preferably, the device is formed on a semiconductor substrate such as silicon. The substrate area is divided into active areas 14 and isolation areas 10. The isolation areas 10 preferably comprise shallow trench isolation (STI) as will be described further below. Alternatively, the isolation areas 10 may comprise local oxidation such as LOCOS. However, STI is most preferred. The isolation areas 10 are preferably arrayed in parallel with active areas 14 interleaved. Two cross sections are depicted for the method of formation of the present invention. The A—A cross section illustrates device formation in the active area 14. The B—B cross section illustrates device formation across the isolation regions 10.

Figure 1A:
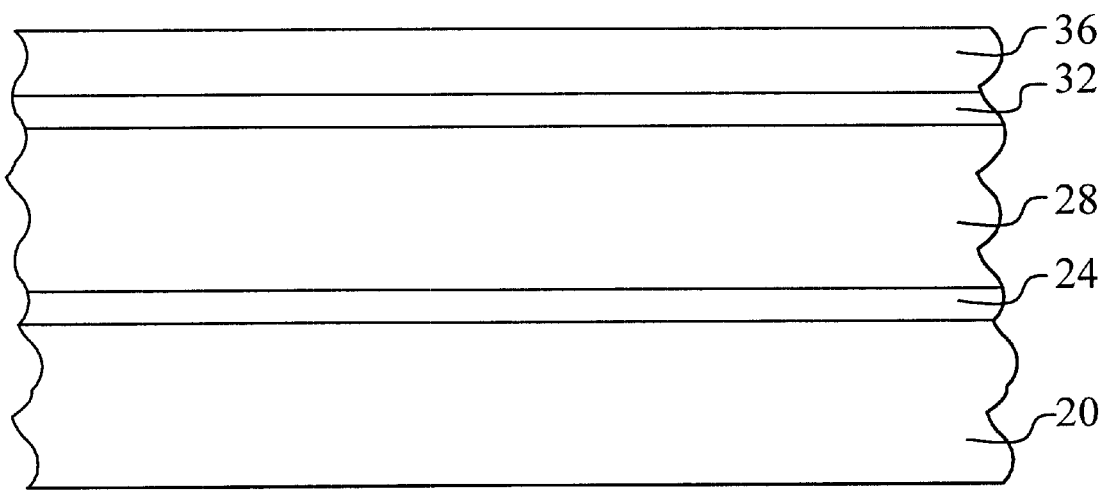

Referring now to FIG. 1A, the A—A cross section is illustrated. The substrate 20 is provided as a starting point. A temporary layer 24, 28, 32, and 36, is then formed overlying the substrate 20. The purpose of the temporary layer is to aid in forming shallow trench isolations (STI) having a preferred topology. The temporary layer preferably comprises a pad oxide layer 24, a silicon nitride layer 28, and a capping layer 32 and 36. This capping layer 32 and 36 preferably further comprises a two-layer stack that can be removed to create notches of a preferred depth as will be described below. The capping layer preferably comprises an oxide etch stop layer 32 and a silicon nitride layer 36.

Figure 1B:
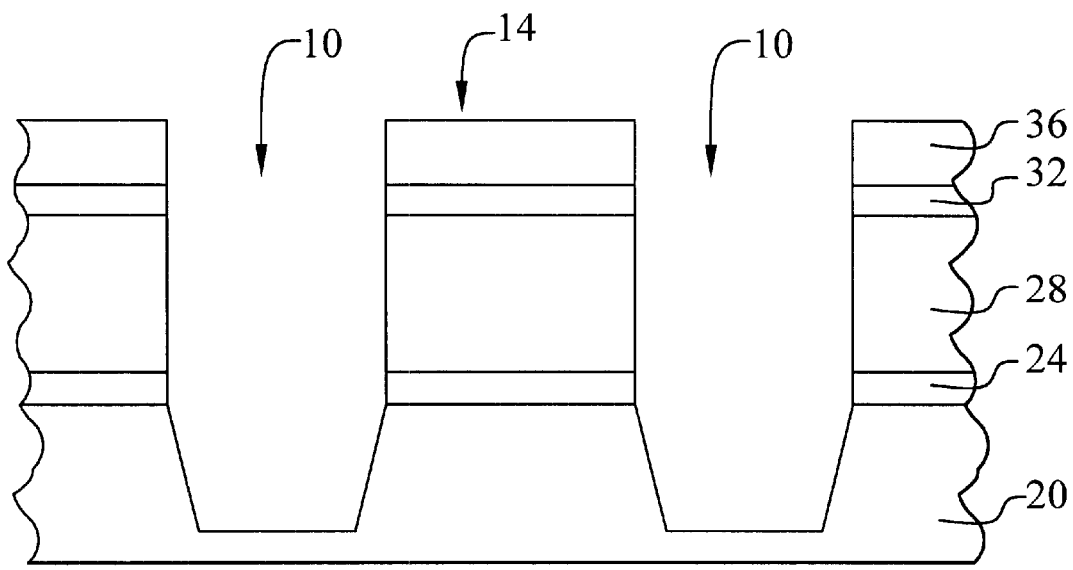

Referring now to FIG. 1B, the B—B cross section is shown. The temporary layer 24, 28, 32, and 36, and the substrate 20 are patterned to form trenches 10 for planned STI regions. These STI regions 10 bound active areas 14 where flash devices are planned. The patterning preferably comprises a photolithographic and etching process where a photosensitive layer, such as photoresist, is deposited overlying the temporary layer 24, 28, 32, and 36. This photosensitive layer, not shown, is then exposed to actinic light through a mask and developed as is well known in the art.

The remaining photosensitive layer is used to mask an etching process whereby the temporary layer and the substrate are etched to form the trenches 10.

Figure 2B:
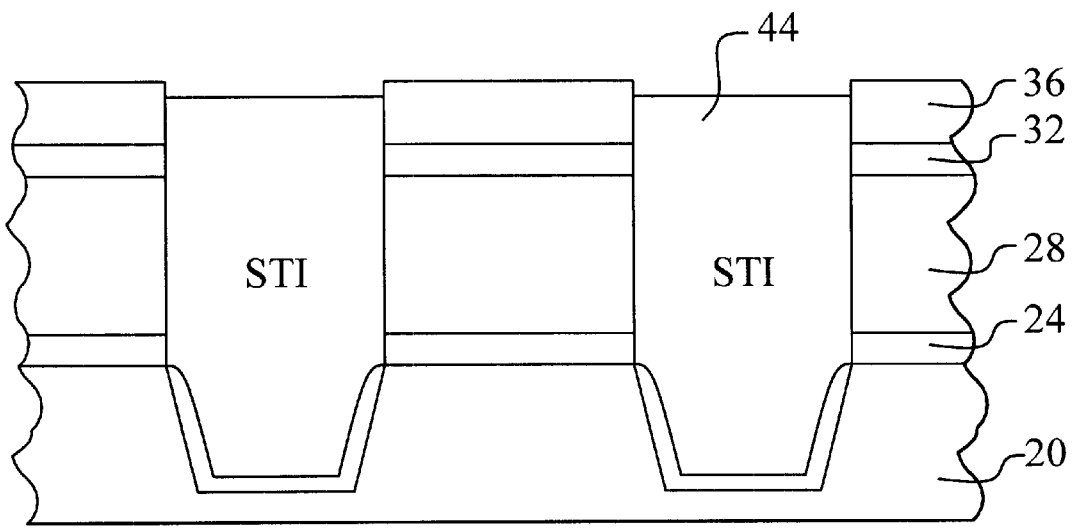

Referring now to FIG. 2B, the B—B cross section is shown for a further step in the method. A trench oxide 44 is deposited overlying the temporary film and filling the trenches. Preferably, a liner oxide layer 40 is first grown to line the trenches in the substrate 20. It is found that this improves isolation quality by reducing leakage current between devices. The trench oxide layer 44 preferably comprises a high density plasma (HDP) oxide to insure complete filling without creating voids. The trench oxide layer 44 is then polished down to below the top surface of the temporary film layer 24, 28, 32, and 36.

Figure 3A:
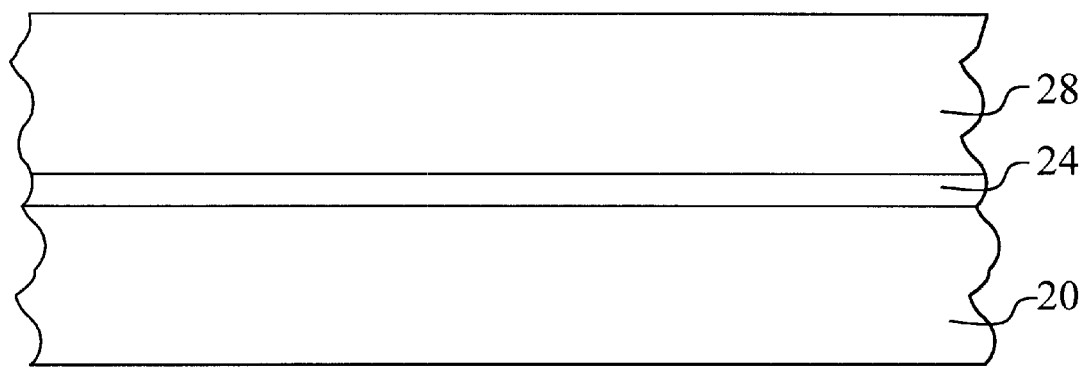
Figure 3B:
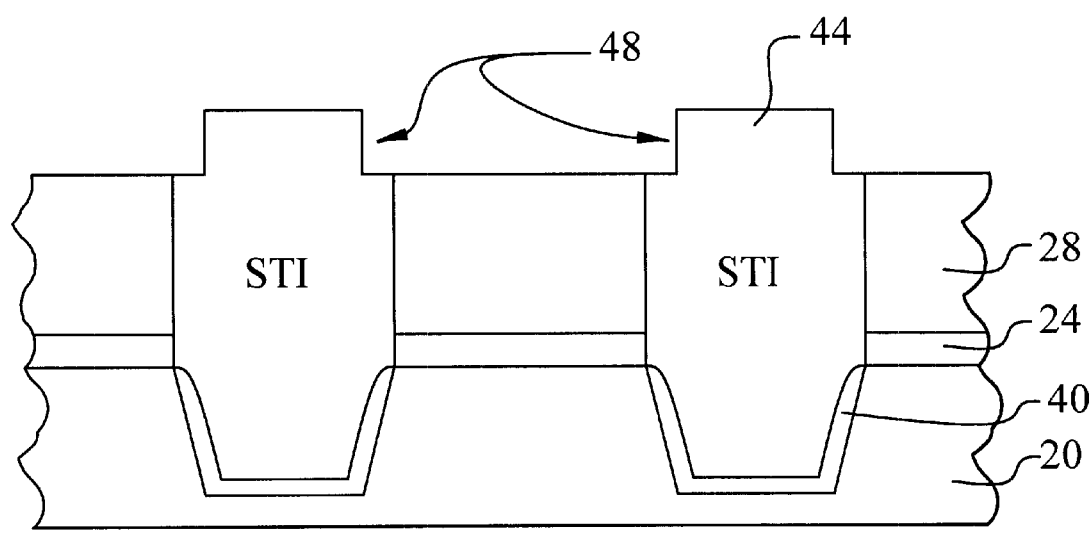

Referring now to FIG. 3A, the A—A cross section is shown. At this point, an important step in the method occurs. The capping layer 32 and 36 of the temporary film is etched down. In the A—A cross section, this etching down simply reveals the underlying layers in the temporary film layer stack 24 and 28. Referring now to FIG. 3B, the B—B cross section is shown. The etching down of the capping layer 32 and 36 creates notches 48 in the trench oxide layer 44 of the STI. The etching down process first removes the topmost silicon nitride layer 36 to expose the underlying oxide etch stopping layer 32. In addition, the sidewalls of the trench oxide layer 44 are exposed at the top corners. The vertical length of sidewall exposure is roughly equal to the thickness of the nitride layer 36. Next, the oxide etch stopping layer 32 is etched away. During this etching, a lateral width of trench oxide material 44 is removed from the exposed sidewalls. This lateral width is roughly equal to the thickness of the oxide etch stopping layer 32. Notches 48 are thereby formed at the top edges of the trench oxide layer 44 sidewalls. The presence of these notches 48 is particularly useful in the formation of a floating gate having an improved topology as will be discussed below.

Figure 4A:
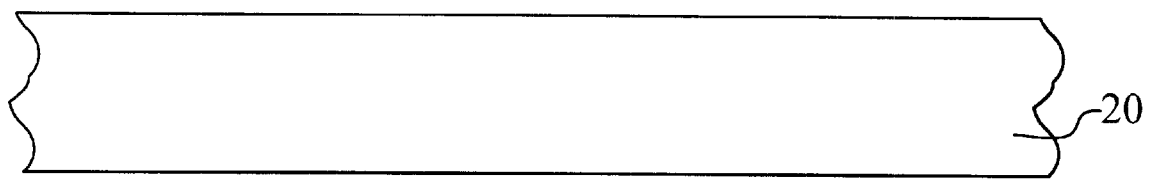
Figure 4B:
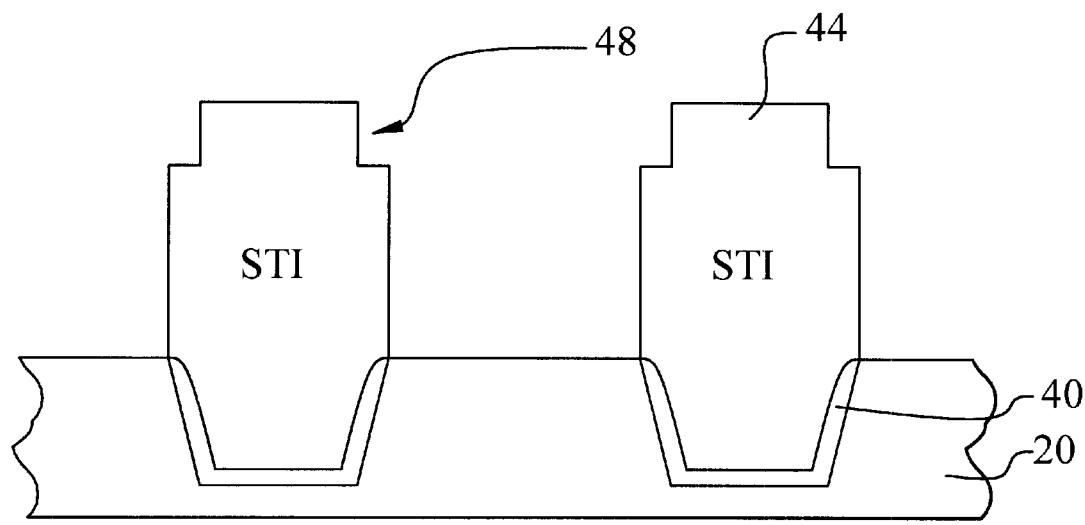

Referring now to FIG. 4A, the A—A cross section is again illustrated. The final layers 24 and 28 of the temporary film layer are removed to expose the substrate 20 in the active areas. Referring now to FIG. 4B, the B—B cross section shows the resulting device in the areas including the STI regions. The relatively large thickness of the silicon nitride layer 28 protects the trench oxide layer 44 of the STI regions during an etching step that is selective to nitride over oxide. The resulting STI regions 44 protrude significantly above the substrate 20. The notches 48 remain.

Figure 5A:
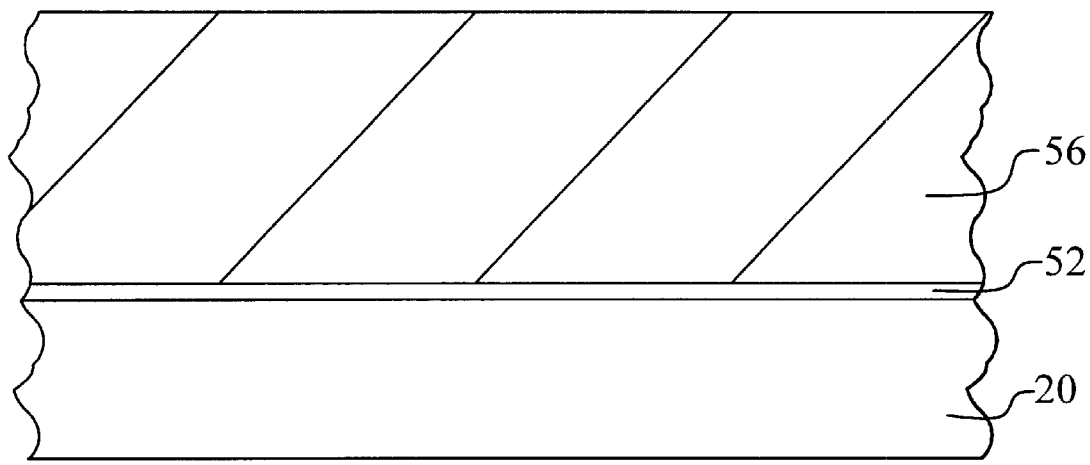

Referring now to FIG. 5A, another important step in the method of the present invention is illustrated. A first film comprising a first oxide layer 52 and a floating gate layer 56 is formed overlying the substrate 20. The first oxide layer 52 preferably comprises a silicon oxide layer that is formed by thermal oxidation of the silicon surface. Alternatively, a chemical vapor deposited (CVD) oxide may be deposited. The floating gate layer 56 comprises a conductive material and, more preferably, comprises polysilicon. This polysilicon layer 56 is preferably deposited by a CVD process as is well known in the art.

Figure 5B:
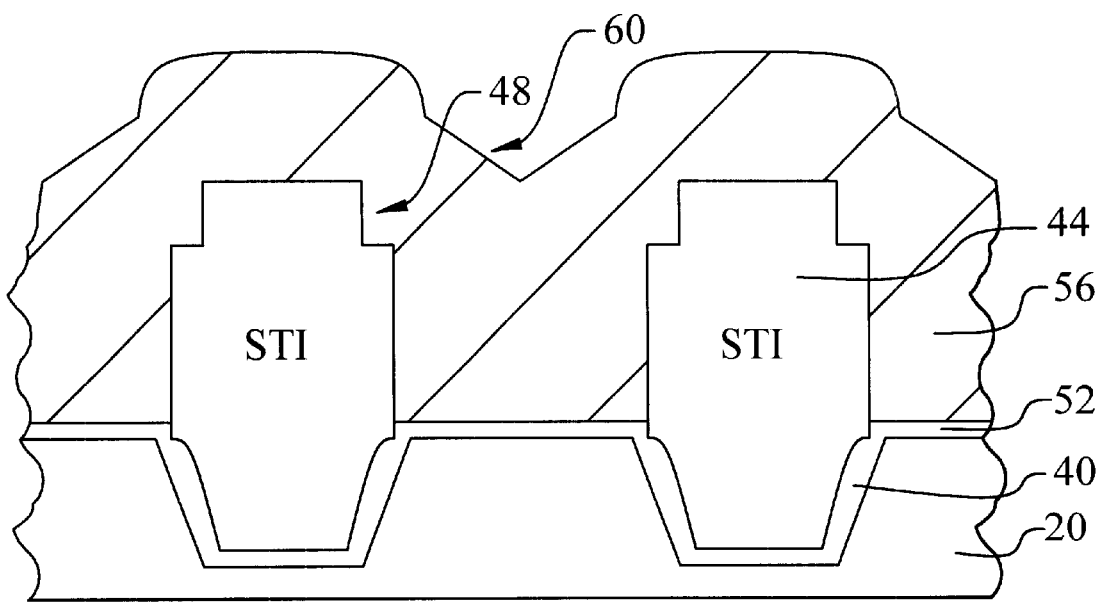

Referring now to FIG. 5B, the resulting structure is shown for the B—B cross section. The first oxide layer 52 forms overlying the surface of the substrate 20 in the active areas. The floating gate layer 56 is formed overlying the first oxide layer 52 and, most importantly, overlying the STI trench oxide layer 44. The spaces between the STI oxide stacks are filled by the floating gate layer 56. As a very important feature, the presence of the notches 48 at the upper corners of the STI regions 44 causes an angled surface profile 60 in the deposited floating gate layer 56. The preferred floating gate layer 56 deposition conforms to the opening between the STI regions 44 and to the notches 48. For example, a high density plasma CVD can be used to deposit a polysilicon layer 56 with the preferred angled surface profile 60 in response to the underlying notches 48.

Figure 6:
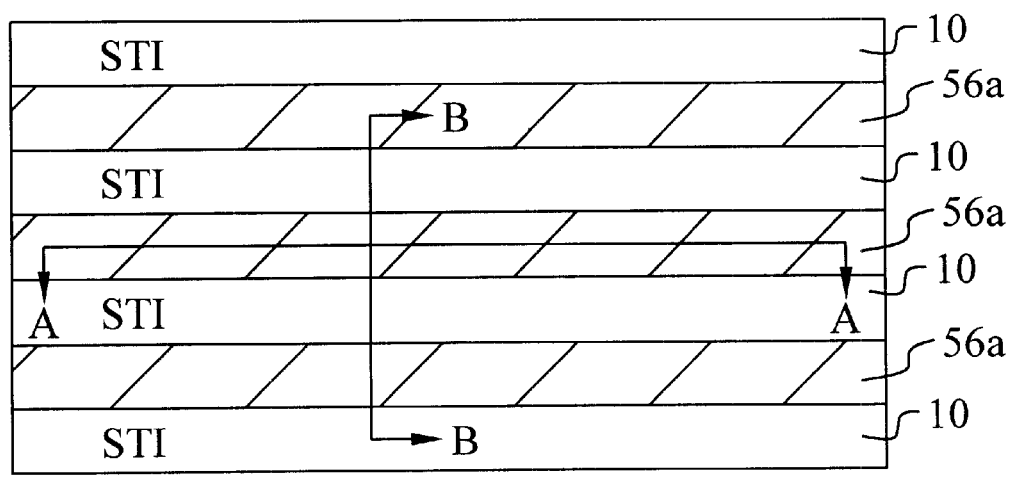
Figure 6A:
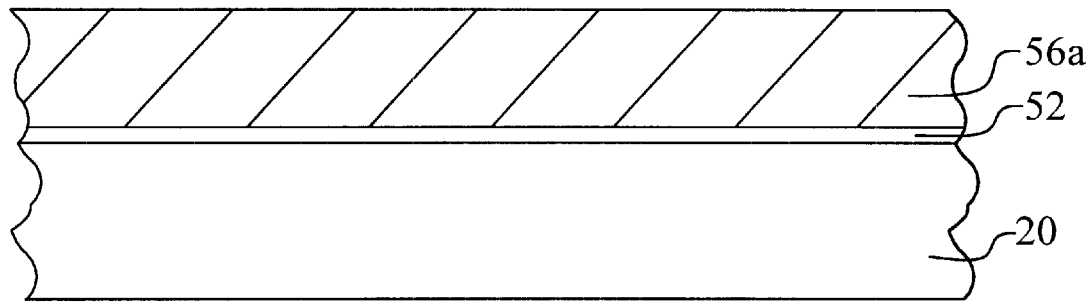
Figure 6B:
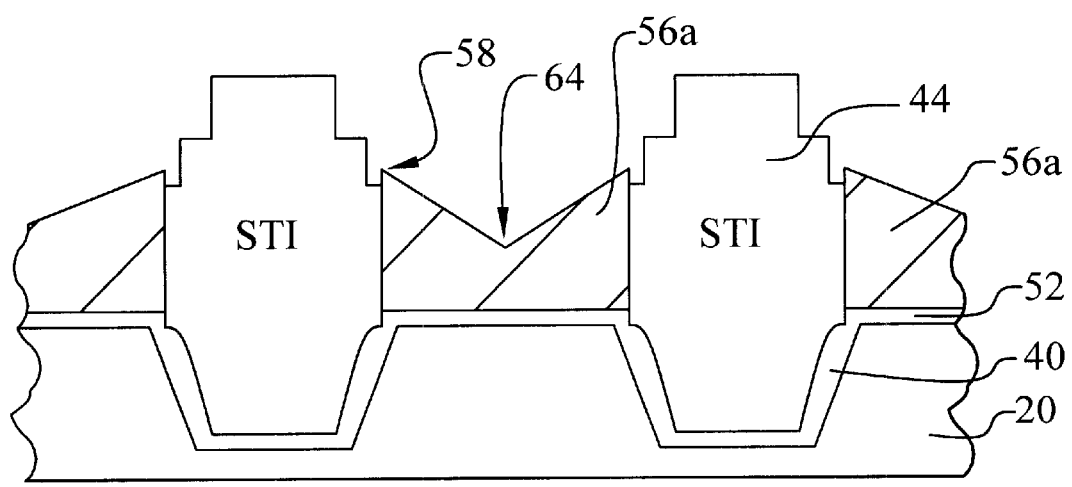

Referring now to FIG. 6, a top layout view of the device of the present invention is again shown. As an important feature, the floating gate layer 56 is etched down to below the top surface of the STI regions 10 to thereby confine the resulting floating gate layer 56a to between the STI regions 10. Referring now to FIG. 6A, the resulting A—A cross section is shown. The height of the floating gate layer 56a is simply reduced. Referring now to FIG. 6B, the resulting B—B cross section is shown. The etching down step reduces the height of the floating gate layer 56a and confines it to between the STI regions 44. Further, the floating gate layer 56a retains the preferred angled surface profile 64 that was created during the deposition step. The etching down step results in the formation of the floating gates 56a for the planned flash devices.

Next, an additional amount of the STI oxide 44 is removed to expose the tip 58 of the floating gate 56a. Preferably, an isotropic oxide etch, such as an oxide dip, is performed. More preferably, about 100 Angstroms of the STI oxide 44 are removed to expose the tip 58. The exposed tip 58 is important for erasing, by tunneling, from the polysilicon tip 58 to an overlying word line, not shown.

Figure 7:
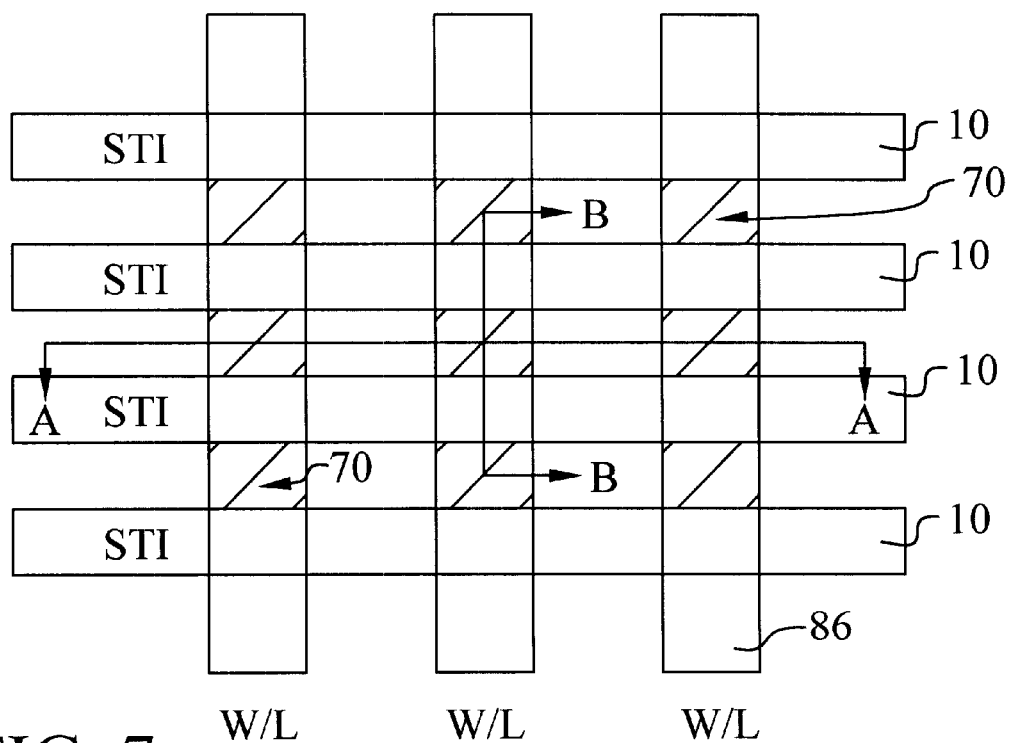

Referring now to FIG. 7, the top layout view is again illustrated. A second film layer is formed overlying the first film layer and the STI regions 10. This second film layer is then patterned to form stacked gates 70 and word lines (W/L) 86 for the flash devices.

Figure 7A:
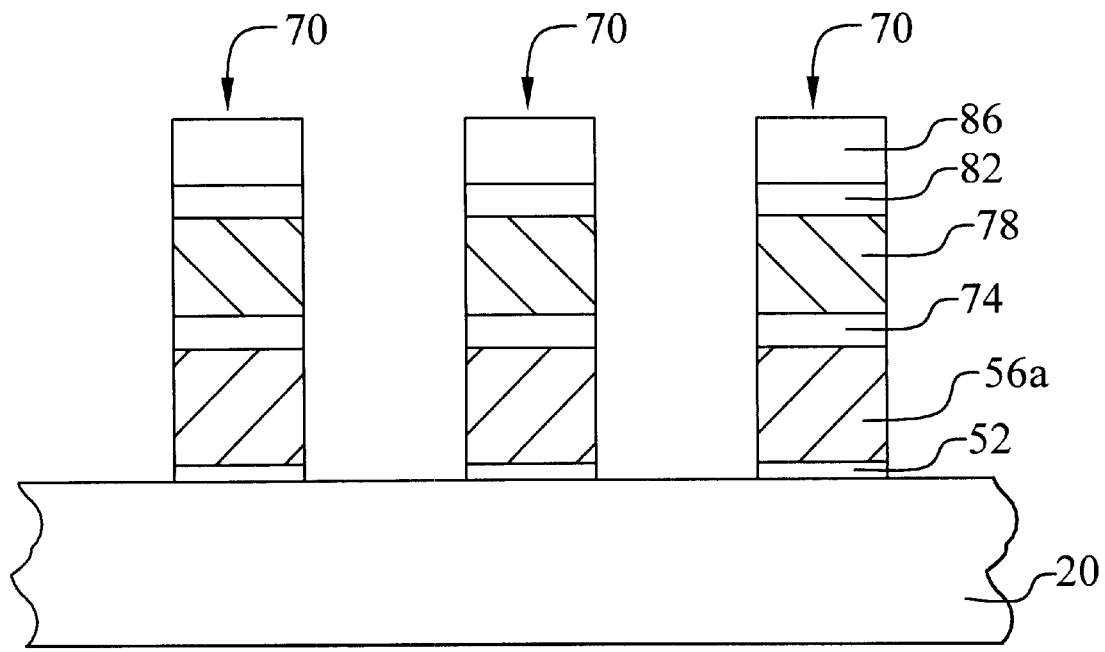

Referring now to FIG. 7A, the A—A cross section illustrates the active area section. The second film layer 74, 78, 82, and 86, is formed overlying the first film 56a and 52 and the substrate 20. The second film layer preferably comprises a second oxide layer 74, a control gate layer 78, and an insulating layer 82 and 86. The second oxide layer 74 preferably comprises a silicon oxide layer that is grown by thermal oxidation. The underlying floating gate layer 56a polysilicon may first be exposed by an acid dip to facilitate growing a clean, second oxide layer 74. The control gate layer 78 preferably comprises polysilicon. This polysilicon layer 78 may be deposited by CVD as is well known in the art. The insulating layer 82 and 86 preferably comprises a silicon nitride layer 86 overlying an oxide layer 82.

The second film 86, 82, 78, and 74, and the first film 56 and 52 are then patterned to form stacked gates 70 for the planned flash devices. The patterning step may be completed using a photolithography and etching sequence. A photoresist layer, not shown, is deposited overlying the second film. The photoresist is exposed to actinic light through a mask and is developed. The remaining photoresist layer is then used to mask the etching of the second film and the first film.

Figure 7B:
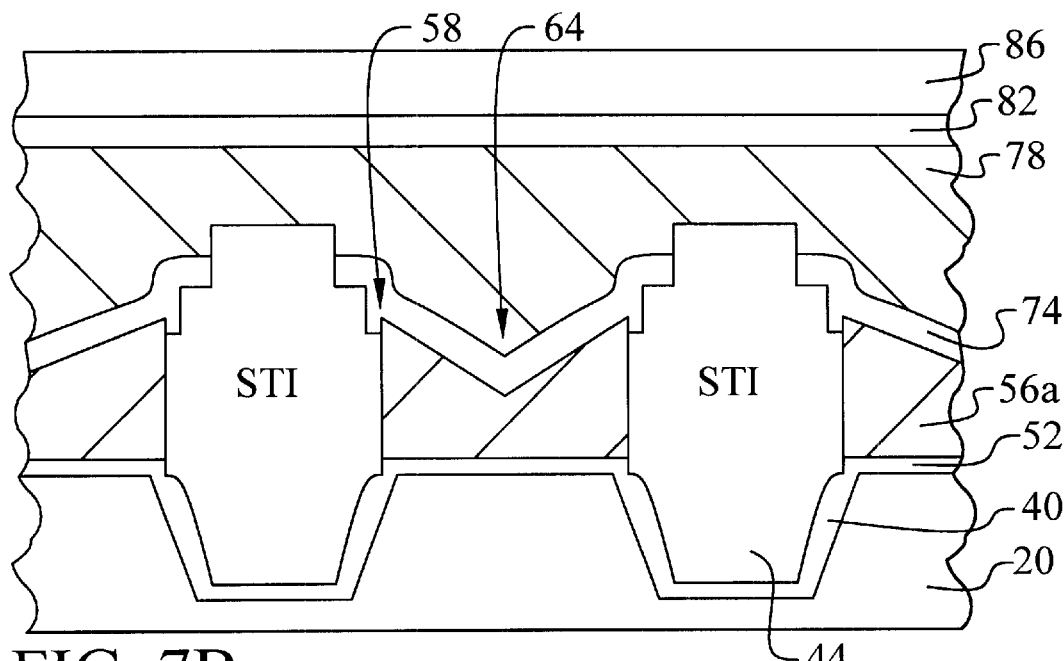

Referring now to FIG. 7B, the B—B cross section is shown. In this cross section, the second film 74, 78, 82, and 86, is shown formed overlying the floating gate 56a formed by the first film and the STI structures 44. Note how the novel, angled profile 64 of the floating gate 56a is mirrored by the conformal second oxide layer 74 and the control gate layer 78. The resulting stacked, control and floating gates 78 and 56a exhibit an enhanced electric field between the floating gate and control gate due to the angled profile 64. In addition, the control gates 78 of a plurality of flash transistors are coupled together by the contiguous control gate layer 78. Finally, the poly tip 58 position relative to the control gate 78, or word line, is shown.

Figure 8A:
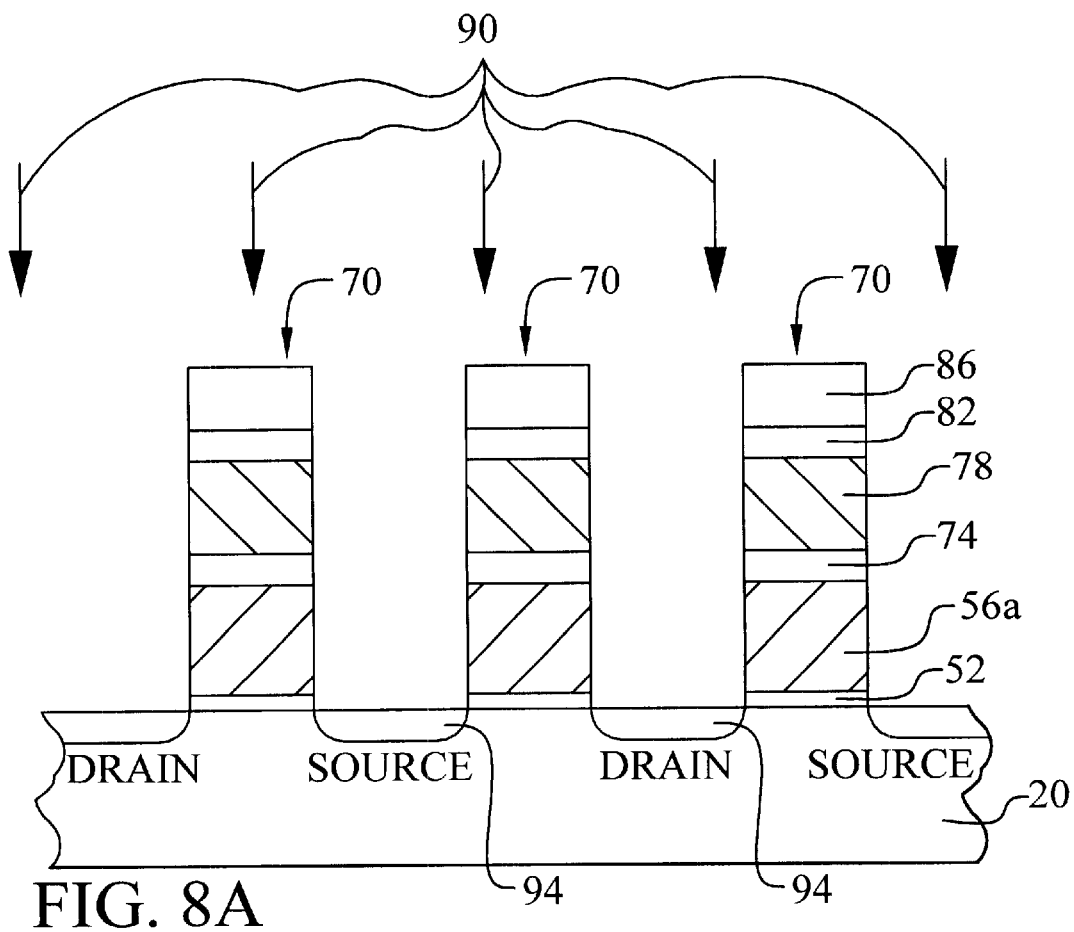

Referring now to FIG. 8A, ions are implanted 90 into the substrate 20 to form source and drain regions 94. Preferably, arsenic is used to create N+ drain and source regions 94 having a high concentration but a relatively shallow depth. The resulting source and drain regions 94 are self-aligned to the flash stacked gates 70.

Figure 9A:
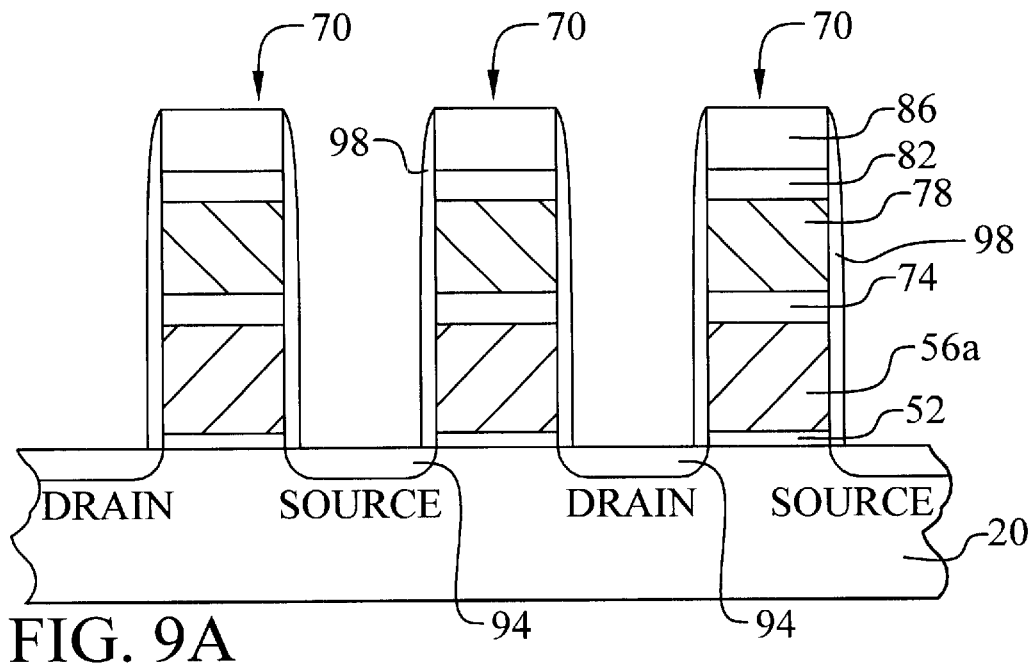

Referring now to FIG. 9A, an important feature of the present invention is illustrated. A third oxide layer 98 is formed on the sidewalls of the stacked gates 70. The third oxide layer 98 preferably comprises a silicon oxide layer. This third oxide layer 98 preferably comprises an HTO oxide that is first deposited and is then etched down to create the sidewall oxide surface shown. This third oxide layer 98 permits a subsequently formed conductive plug layer to be capacitively coupled to the floating gate 56a to improve the programming and erasing performance.

Figure 10A:
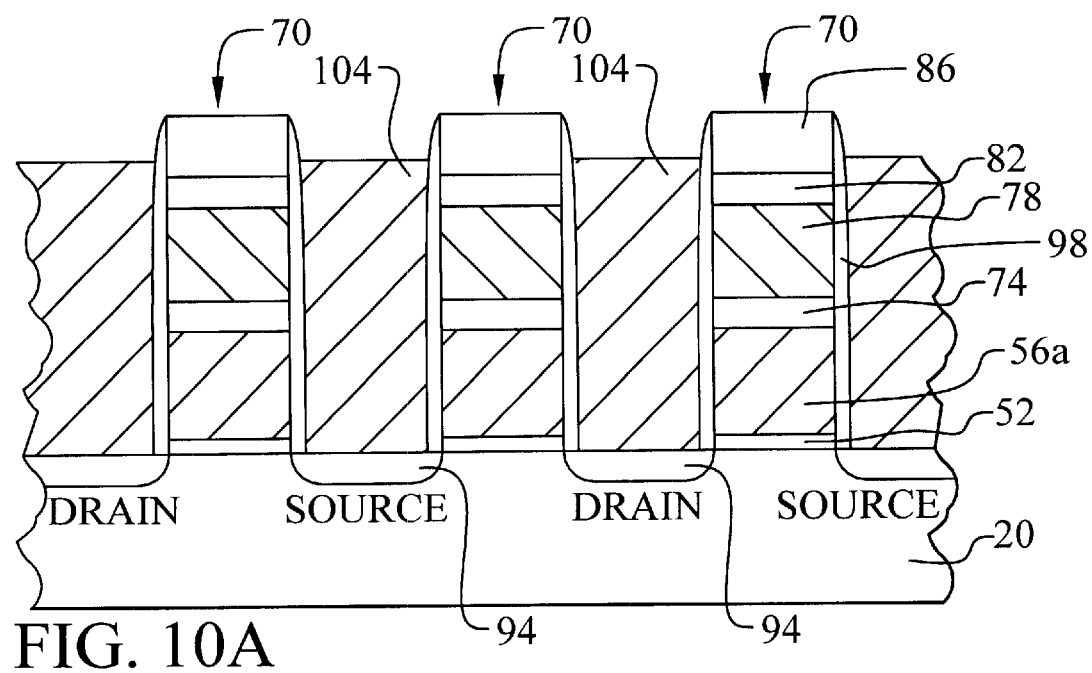

Referring now to FIG. 10A, the A—A cross section is again displayed. In this case, conductive plugs 104 are formed between the stacked gates 70. A conductive plug layer 104 is deposited overlying the stacked gates 70 and filling the spaces between the stacked gates 70. The conductive plug layer 104 preferably comprise polysilicon 104. Further, this polysilicon layer 104 may comprise a CVD deposited layer. The conductive plug layer 104 is etched down to below the top surface of the insulating layer 82 and 86 to complete the flash device. The conductive plugs 104 are coupled to the underlying source and drain regions 94.

As an important feature, a voltage may be coupled to the conductive plugs 104 of the drain or the source side of the flash device. This voltage is easily and efficiently coupled onto the floating gate 56a. The coupling coefficient is larger than in the prior art. This improvement is due to increased coupling area. The parallel surface areas between the vertical conductive plugs 104 and the floating gates 56a are much larger than the overlap surfaces between the floating gates and the drains/sources 94 in the substrate 20. Further, if the drain and source conductive plugs 104 for a single flash device are driven to the same voltage, then this voltage is coupled with double the surface area. As a result, the novel flash structure of the present invention can be programmed or erased using reduced voltage levels and/or reduced wait times.

Figure 11A:
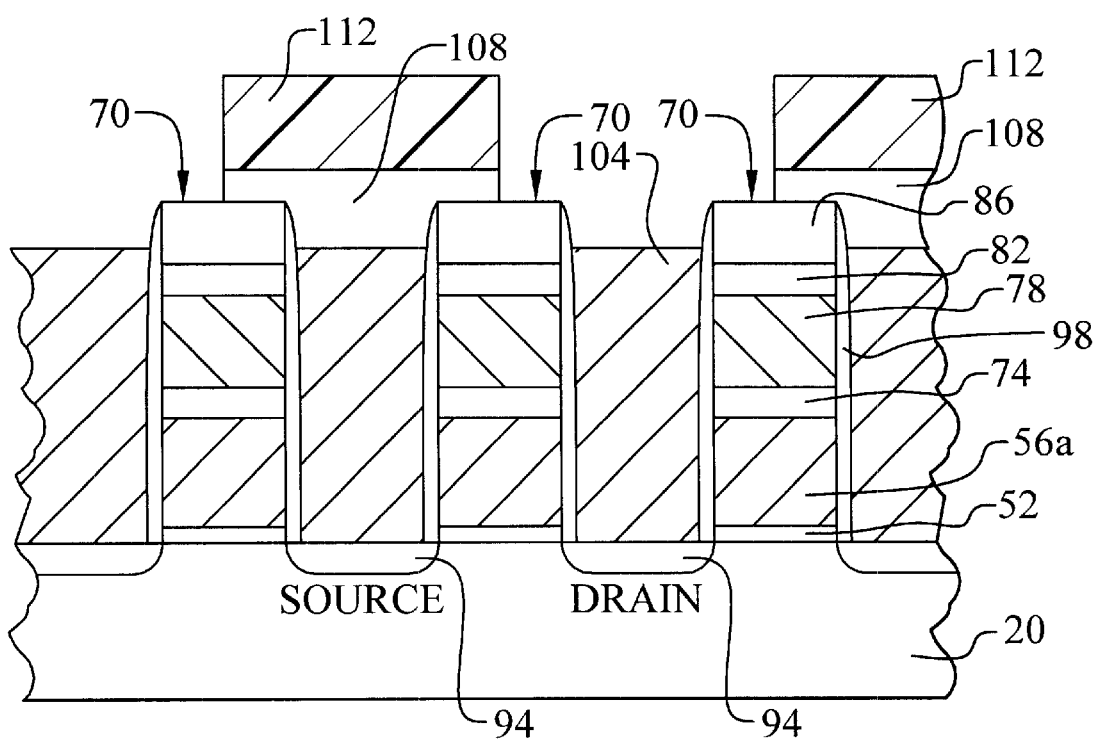

Referring now to FIG. 11A, the A—A cross section illustrates a subsequent step that may be used in the manufacturing process. To facilitate use of the flash devices in an efficient memory array, bit lines are formed that couple groups of drains onto a single signal. A masking layer 108 is formed overlying the completed devices. The masking layer 108 is then patterned using, for example, a photoresist layer 112. The masking layer is left covering the source conductive plugs 104. Meanwhile, the drain conductive plugs 104 are exposed.

Figure 12:
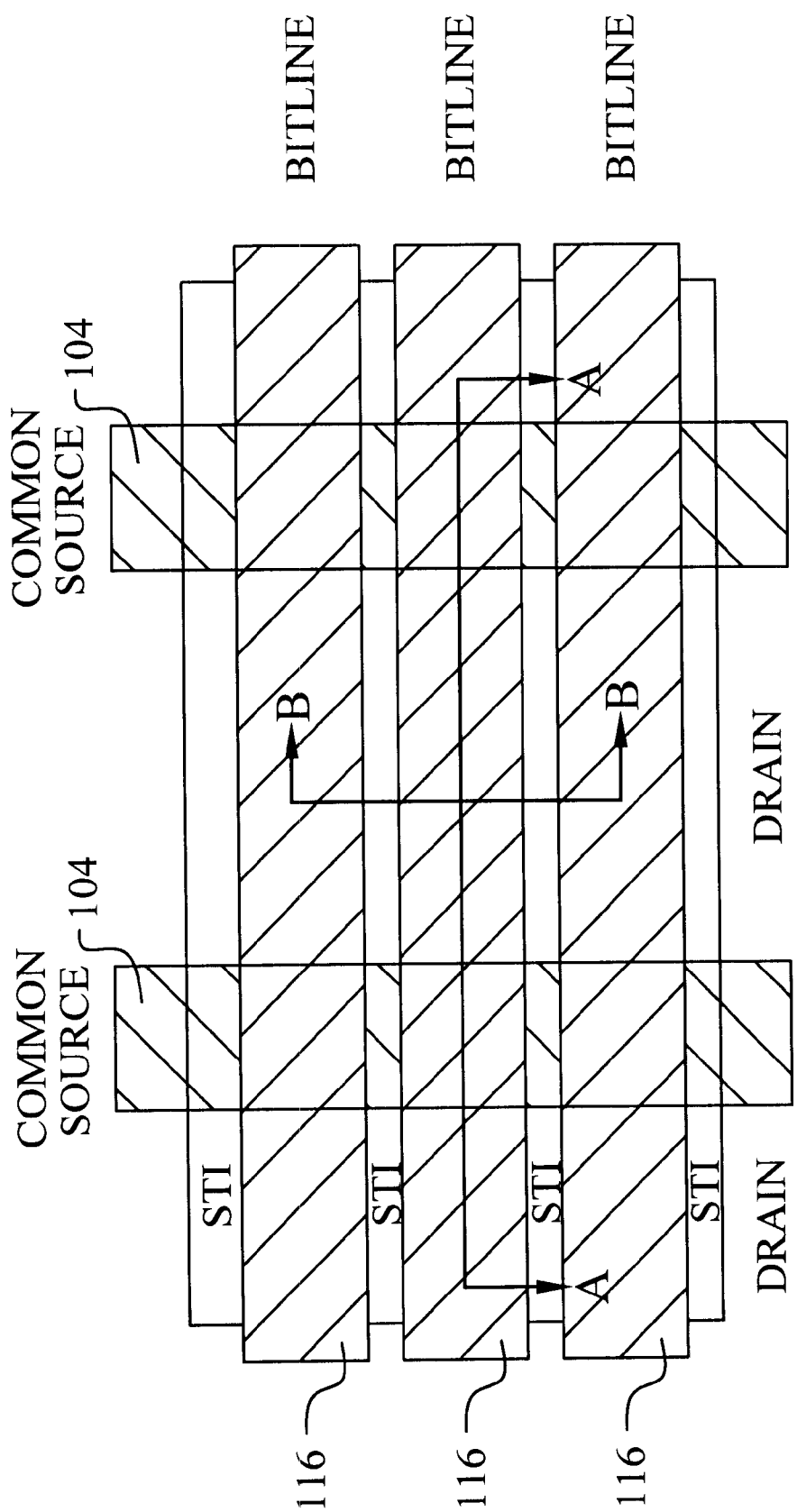

Referring now to FIG. 12, a top layout view is illustrated. In this layout view, a common source line is shown formed by the conductive plug layer 104 that is coupled to the sources. A bit line layer is then deposited and patterned to form the bit lines 116. These bit lines 116 couple the drain conductive plugs in a row to form a common bit line.

Figure 12A:
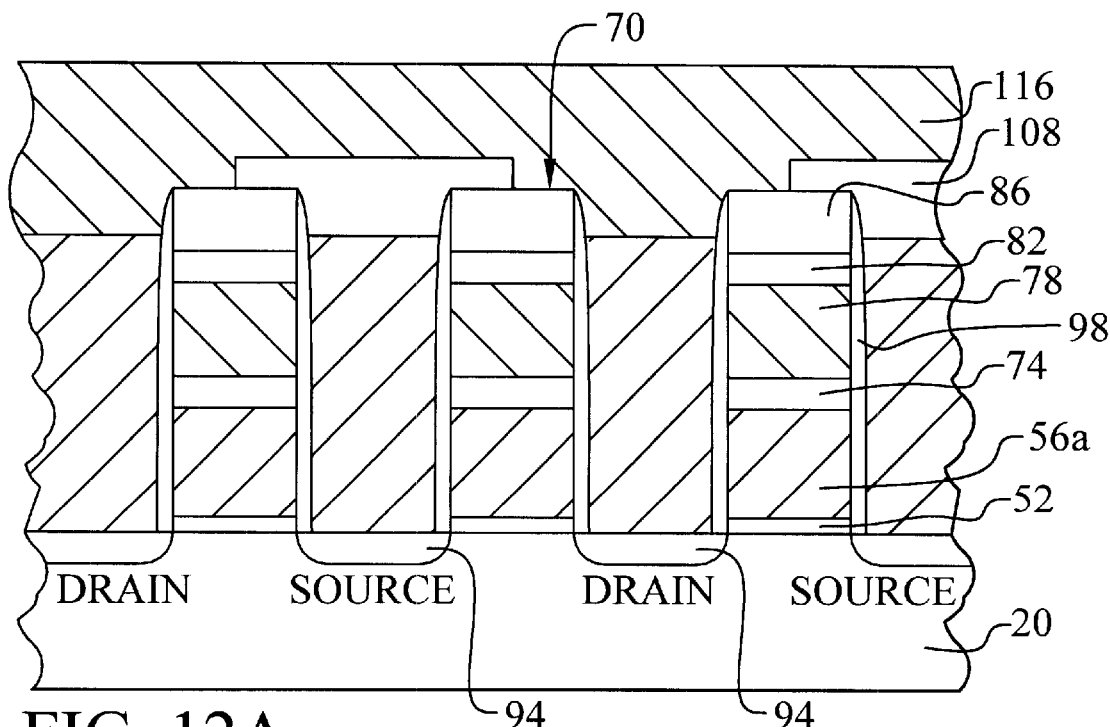
Figure 12B:
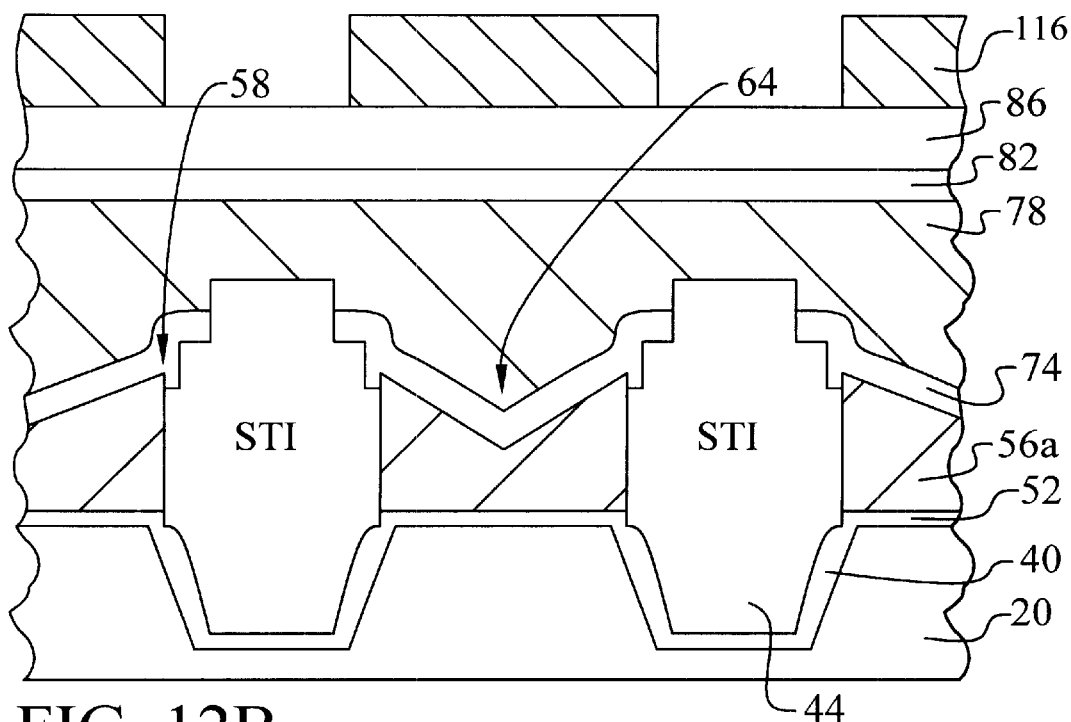

Referring now to FIG. 12A, the A—A cross section is shown. The bit line layer 116 overlies the masking layer 108 and the drain conductive plugs 104. The bit line layer 116 preferably comprises a conductive layer and, more preferably, comprises a polysilicon layer. Referring now to FIG. 12B, the bit line layer 116 is shown for the active area direction only. The bit line layer 116 has been patterned to form a series of bit lines 116.

Referring again to FIG. 12A, the novel flash device of the present invention is now described. The device comprises a substrate 20. A stacked gate 70 comprises a floating gate 56a and 52 and a control gate 78 and 74. The floating gate comprises a first oxide layer 52 overlying the substrate 20 and a floating gate layer 56a overlying the first oxide layer 52. The control gate 78 comprises a second oxide layer 74 overlying the floating gate layer 56a and a control gate layer 78 overlying the second oxide layer 74. Source and drain regions 94 are in the substrate 20 adjacent to the stacked gate 70. A third oxide layer 98 covers the sidewalls of the stacked gate 70. Conductive plugs 104 contact the source and drain regions 94 and extend parallel to the stacked gate 70. The conductive plug layer 104 provides coupling between the drain and source 94 and the floating gate 56a.

The programming operation of the device of the present invention may now be described. Referring again to FIG. 12A, to program the flash device, electrons will be energized to tunnel from the control gate 78 to the floating gate 56a. To accomplish this, the control gate of the selected cell is driven to a large, negative voltage of, for example, about −7 Volts. This is accomplished in a large array by driving the word line voltage for the flash cell to about −7 Volts. Since the floating gate 56a is not directly coupled to a signal, the drain and source regions 94 must be used to create the large programming potential across the second oxide layer 74. Therefore, the drain and source for the selected cell are driven to, for example, about 6 Volts.

The novel structure of the present invention is ideally suited to maximize the effect of the above-cited conditions. First, the drain and source conductive plugs 104 and the thin, third oxide layer 98 allow the drain and source voltage to efficiently couple onto the floating gate 56a. Second, the presence of the conductive plugs 104 on two sides of the floating gate 56a maximizes the voltage coupling onto the floating gate 56a. Third, referring again to FIG. 12B, the angled profile of the floating gate 56a and control gate 78 interface concentrates the electric filed. This field concentration, in turn, increases the charge flow for a given voltage potential. The control gate 78 negative voltage can be therefore be minimized. The programming wait time can also be reduced.

The erasing operation for the device is similar to the programming operation. However, to erase the device, the control gate must receive a positive voltage and the drain and source must receive a low voltage. For example, the word lines may be driven to about 13 Volts. The drain and source conductive plugs are then driven to, for example, about 0 Volts. In this type of erasing method, a block of cells may be erased at one time. In this case, all the cells coupled to the word line that is driven to the programming voltage are erased. Referring again to FIG. 12B, the floating gate tips 58 improve the efficiency of erasing.

The erasing operation may be modified to simply erase only those devices that are selected. In this case, the drain conductive plugs 104 are driven to about 0 Volts only for the selected devices. Non-selected cells are driven to a voltage of, for example, about 6 Volts. This higher voltage on the non-selected bit line reduces the energy on the non-selected floating gates and thereby prevents erasing. This technique allows for a bit-by-bit erasing of selected flash cells in an array.

Finally, the device can be read by forcing a reading voltage of, for example, about 6 Volts on the word lines, or control gates 78. A small drain-to-source voltage of, for example, about 2 Volts is coupled onto the drain-to-source of the device via the conductive plugs 104. A sense amplifier detects current flow through the device during the test to determine the floating gate charge-state. The relatively low voltages required for programming, erasing, and reading the flash cells of the present invention improves performance and reduces product cost.

The advantages of the present invention may now be summarized. An effective and very manufacturable method of forming a flash memory device is achieved. A flash memory device with improved programming efficiency is formed. The flash programming efficiency is improved by coupling the drain and source voltage to the floating gate using a thin oxide layer between the drain and source plugs and the floating gate. The programming efficiency is also improved by forming an angled profile in the floating gate to enhance the control gate to floating gate electric field.

As shown in the preferred embodiments, the novel method and device of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form flash memory devices in the manufacture of an integrated circuit device comprising:

providing a substrate;

forming STI regions in said substrate wherein said STI regions protrude substantially above the top surface of said substrate;

forming a first film overlying said substrate and said STI regions wherein said first film comprises a floating gate layer overlying a first oxide layer;

etching down said first film to expose said STI regions;

thereafter forming a second film comprising a second oxide layer overlying said first film, a control gate layer overlying said second oxide layer, and an insulating layer overlying said control gate layer;

patterning said first and second films to form stacked gates comprising floating gates and control gates;

implanting ions into said substrate between said stacked gates to form source and drain regions;

thereafter forming a third oxide layer on the sidewalls of said stacked gates;

thereafter depositing a plug layer overlying said substrate and said stacked gates and filling spaces between said stacked gates; and etching down said plug layer to below the top surface of said stacked gates to form conductive plugs contacting said source and drain regions and to complete said flash memory devices.

2. The method according to claim 1 wherein said floating gate layer comprises polysilicon.

3. The method according to claim 1 wherein said control gate layer comprises polysilicon.

4. The method according to claim 1 wherein said plug layer comprises polysilicon.

5. The method according to claim 1 wherein said step of forming STI regions in said substrate comprises:

depositing a temporary film overlying said substrate wherein said temporary film comprises a capping layer;

thereafter patterning said temporary film and said substrate to form trenches for STI regions that bound active areas where said flash devices are planned;

depositing a trench oxide overlying said temporary film and filling said trenches;

polishing down said trench oxide layer to below the top surface of said temporary film;

thereafter removing said capping layer wherein notches are formed at the top corners of said trench oxide adjacent to said temporary film;

thereafter removing remaining said temporary film such that said trench oxide of said STI regions protrudes substantially above said substrate; and etching down said floating gate layer prior to said step of forming said second film wherein said floating gate layer remains only in areas between said STI regions and wherein the surface profile of said floating gate layer is angled to enhance an electric field.

6. The method according to claim 5 further comprising etching said trench oxide after said step of etching down said floating gate layer to thereby expose tips of said floating gate layer.

7. The method according to claim 1 further comprising:

forming a masking layer overlying said plug layer coupled to said sources;

depositing a bit line layer overlying said plug layer said masking layer, and said stacked gates;

patterning said bit line layer and exposed said plug layer to form bit lines and to form source lines.

8. A method to form flash memory devices in the manufacture of an integrated circuit device comprising:

providing a substrate;

depositing a temporary film overlying said substrate prior to said step of forming said first film wherein said temporary film comprises a capping layer;

patterning said temporary film and said substrate to form trenches for STI regions that bound active areas where said flash devices are planned;

depositing a trench oxide overlying said temporary film and filling said trenches;

polishing down said trench oxide layer to below the top surface of said temporary film;

thereafter removing said capping layer wherein notches are formed at the top corners of said trench oxide adjacent to said temporary film;

thereafter removing remaining said temporary film such that said trench oxide of said STI regions protrudes substantially above said substrate;

forming a first film comprising a first oxide layer overlying said substrate and a floating gate layer overlying said first oxide layer;

etching down said floating gate layer wherein said floating gate layer remains only in areas between said STI regions and wherein the surface profile of said floating gate layer is angled to enhance an electric field;

thereafter forming a second film comprising a second oxide layer overlying said first film, a control gate layer overlying said second oxide layer, and an insulating layer overlying said control gate layer;

patterning said first and second films to form stacked gates comprising floating gates and control gates;

implanting ions into said substrate between said stacked gates to form source and drain regions;

thereafter forming a third oxide layer on the sidewalls of said stacked gates;

thereafter depositing a plug layer overlying said substrate and said stacked gates and filling spaces between said stacked gates; and etching down said plug layer to below the top surface of said stacked gates to form conductive plugs contacting said source and drain regions and to complete said flash memory devices.

9. The method according to claim 8 wherein said floating gate layer comprises polysilicon.

10. The method according to claim 8 wherein said control gate layer comprises polysilicon.

11. The method according to claim 8 wherein said plug layer comprises polysilicon.

12. The method according to claim 8 further comprising etching said trench oxide after said step of etching down said floating gate layer to thereby expose tips of said floating gate layer.

13. The method according to claim 8 further comprising:

forming a masking layer overlying said plug layer coupled to said sources;

depositing a bit line layer overlying said plug layer said masking layer, and said stacked gates; and patterning said bit line layer and exposed said plug layer to form bit lines and to form source lines.

* * * * *